United States Patent
Delano

(10) Patent No.: US 6,577,194 B2
(45) Date of Patent: Jun. 10, 2003

(54) RESONANT GATE DRIVE TECHNIQUE FOR A DIGITAL POWER AMPLIFIER

(75) Inventor: Cary L. Delano, Los Altos, CA (US)

(73) Assignee: Tripath Technology, Inc., San Jose, CA (US)

( * ) Notice: Subject to any disclaimer, the term of this patent is extended or adjusted under 35 U.S.C. 154(b) by 123 days.

(21) Appl. No.: 09/796,734

(22) Filed: Feb. 28, 2001

(65) Prior Publication Data

US 2001/0026191 A1 Oct. 4, 2001

Related U.S. Application Data

(60) Provisional application No. 60/186,723, filed on Mar. 3, 2000.

(51) Int. Cl.$^7$ .............................. H03F 3/217; H03F 3/38
(52) U.S. Cl. ...................... 330/251; 330/10; 330/207 A; 330/251; 363/41
(58) Field of Search .............................. 330/10, 207 A, 330/251; 363/41

(56) References Cited

U.S. PATENT DOCUMENTS

| | | | |
|---|---|---|---|
| 4,872,100 A | * 10/1989 | Diaz | ............................ 330/10 |
| 5,023,566 A | 6/1991 | El-Hamamsy et al. | ...... 330/251 |
| 5,479,337 A | 12/1995 | Voigt | ............................ 363/131 |
| 5,777,512 A | 7/1998 | Tripathi et al. | ......... 330/207 A |

OTHER PUBLICATIONS

Sawdai et al. Push–Pull Circuits Using n–p–n and pnp In P. Based HBT's for Power Amplification.
IEEE Transactions on Microwave Theory and Techniques vol. 47, No. 8 Aug. 1999.
Karsten Nielson, "High–Fidelity PWM–Based Amplifier Concept For Active Loudspeaker Systems With Very Low Energy Consumption", J. Audio Eng. Soc., vol. 45 No. 7/8, Jul./Aug. 1997, p. 555–570.

* cited by examiner

Primary Examiner—Michael B Shingleton
(74) Attorney, Agent, or Firm—Beyer Weaver & Thomas LLP

(57) ABSTRACT

Methods and apparatus are described for switching a switch from a first logic state to a second logic state. The switch has a gate terminal having a gate capacitance and a resistance associated therewith. The gate terminal also has a series inductance coupled thereto. While the switch is in the first logic state, a pulse corresponding to the second logic state is applied to the inductance. The pulse has a first level of energy associated therewith which is sufficiently high to overcome damping by the resistance (thus allowing the gate terminal to reach a signal level corresponding to the second logic state thereby switching the switch to the second logic state), and sufficiently low to mitigate oscillation due to the inductance and the gate capacitance (such that the gate terminal settles at the signal level before a subsequent transition of the switch to the first logic state).

75 Claims, 4 Drawing Sheets

RESONANT GATE DRIVE TECHNIQUE FOR A DIGITAL POWER AMPLIFIER

RELATED APPLICATION DATA

The present application claims priority from U.S. Provisional Patent Application No. 60/186,723 for RESONANT GATE DRIVE TECHNIQUE FOR A DIGITAL POWER AMPLIFIER filed on Mar. 3, 2000, the entire disclosure of which is incorporated herein by reference for all purposes.

BACKGROUND OF THE INVENTION

The present invention relates to noise-shaping digital amplifiers, and specifically to techniques for gating the resonant output stage of such amplifiers. It should be noted at the outset that although the invention is described herein with reference to a band pass (e.g., RF) implementation, the present invention is also applicable to other amplifier configurations such as, for example, base band audio amplifiers or motor drive circuits.

FIG. 1 shows a band pass noise-shaping amplifier designed according to techniques described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. The top and bottom side FETs 102 and 104 are alternately driven by gating signals which are generated from the output of A/D converter 106 by gate drive circuitry 108. If FETs 102 and 104 are driven by a switching signal, e.g., a square wave, the parasitic gate capacitances of each device result in heavy and undesirable losses which are proportional to the frequency of the gate signal, the gate capacitance, and the square of the input voltage, i.e., $fcv^2$ losses. Thus, inductors 110 are included in series with each FET gate to resonate out the $fcv^2$ losses. A frequency selective network 112 provides noise shaping for the amplifier in conjunction with a continuous-time feedback path 114. According to a specific embodiment, network 112 comprises one or more resonator stages.

While this results in a reduction of these undesirable losses, there are additional undesirable consequences. First, an undesirable and substantial overshoot (or undershoot) voltage is generated at the input of each FET at gate signal transitions. Second, each gate transition starts a resonance at each gate which wants to continue virtually indefinitely. If the amplifier is intended only to generate a regular pattern of alternating 0s and 1s (as with frequency and phase modulation applications), this resonance is not a problem (if one can live with the overshoot/undershoot) in that it results in the desired bit pattern. For applications in which nonperiodic patterns of bits are desired, this resonance interferes with generation of the desired bit pattern.

It is therefore desirable to provide techniques by which such devices may be switched without suffering from the undesirable effects of traditional techniques for mitigating $fcv^2$ losses.

SUMMARY OF THE INVENTION

According to the present invention, because the series inductor is desirable for reducing $fcv^2$ losses at FET gates, the present invention provides a technique whereby the gate drive circuitry controls the gate signal to overcome the overshoot and resonance problems. That is, the leading and trailing edges of gate pulses generated by the gate drive circuitry are temporarily brought to the desired logic level, brought back to the original logic level, and then brought back to the desired logic level once the signal level at the FET gate has settled at the desired level. To generalize, the present invention employs control logic and an inductor to charge the logic state of a gate capacitor.

Thus, the present invention provides methods and apparatus for switching a switch from a first logic state to a second logic state. The switch has a gate terminal having a gate capacitance and a resistance associated therewith. According to various embodiments, this resistance can be any combination of the input resistance of the switch and external series or parallel resistors. The gate terminal also has a series inductance coupled thereto. While the switch is in the first logic state, a pulse corresponding to the second logic state is applied to the inductance. The pulse has a first level of energy associated therewith which is sufficiently high to overcome damping by the resistance (thus allowing the gate terminal to reach a signal level corresponding to the second logic state thereby switching the switch to the second logic state), and sufficiently low to mitigate oscillation due to the inductance and the gate capacitance (such that the gate terminal settles at the signal level before a subsequent transition of the switch to the first logic state).

A further understanding of the nature and advantages of the present invention may be realized by reference to the remaining portions of the specification and the drawings.

BRIEF DESCRIPTION OF THE DRAWINGS

FIG. 3b is a timing diagram illustrating operation of the embodiment of FIG. 3a; and FIG. 3c is a simplified schematic of one possible implementation of gate drive circuitry for the embodiment of FIG. 3a.

DETAILED DESCRIPTION OF SPECIFIC EMBODIMENTS

Figure 1:
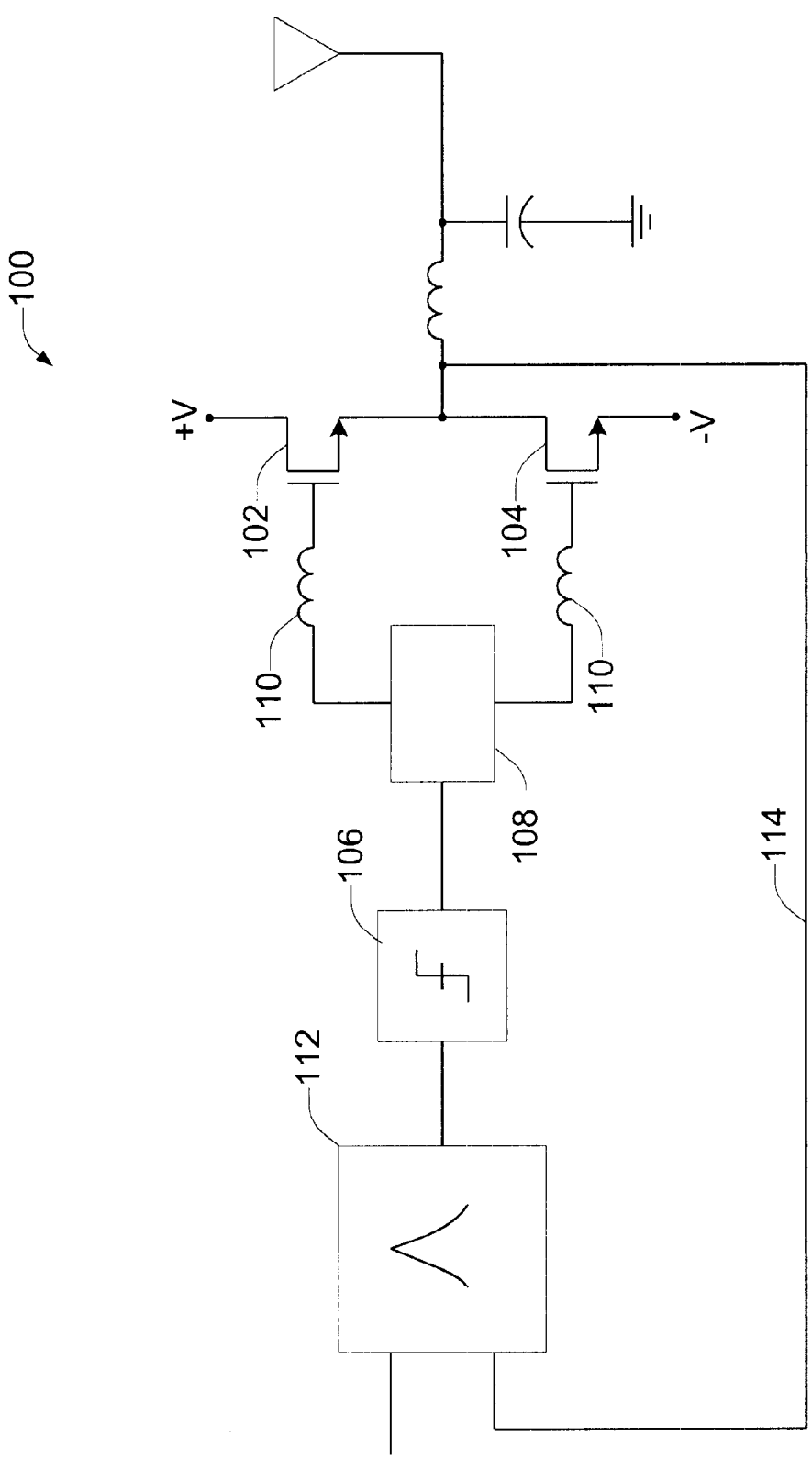
FIG. 1 is a simplified schematic diagram of a noise-shaping amplifier.
Figure 2A:
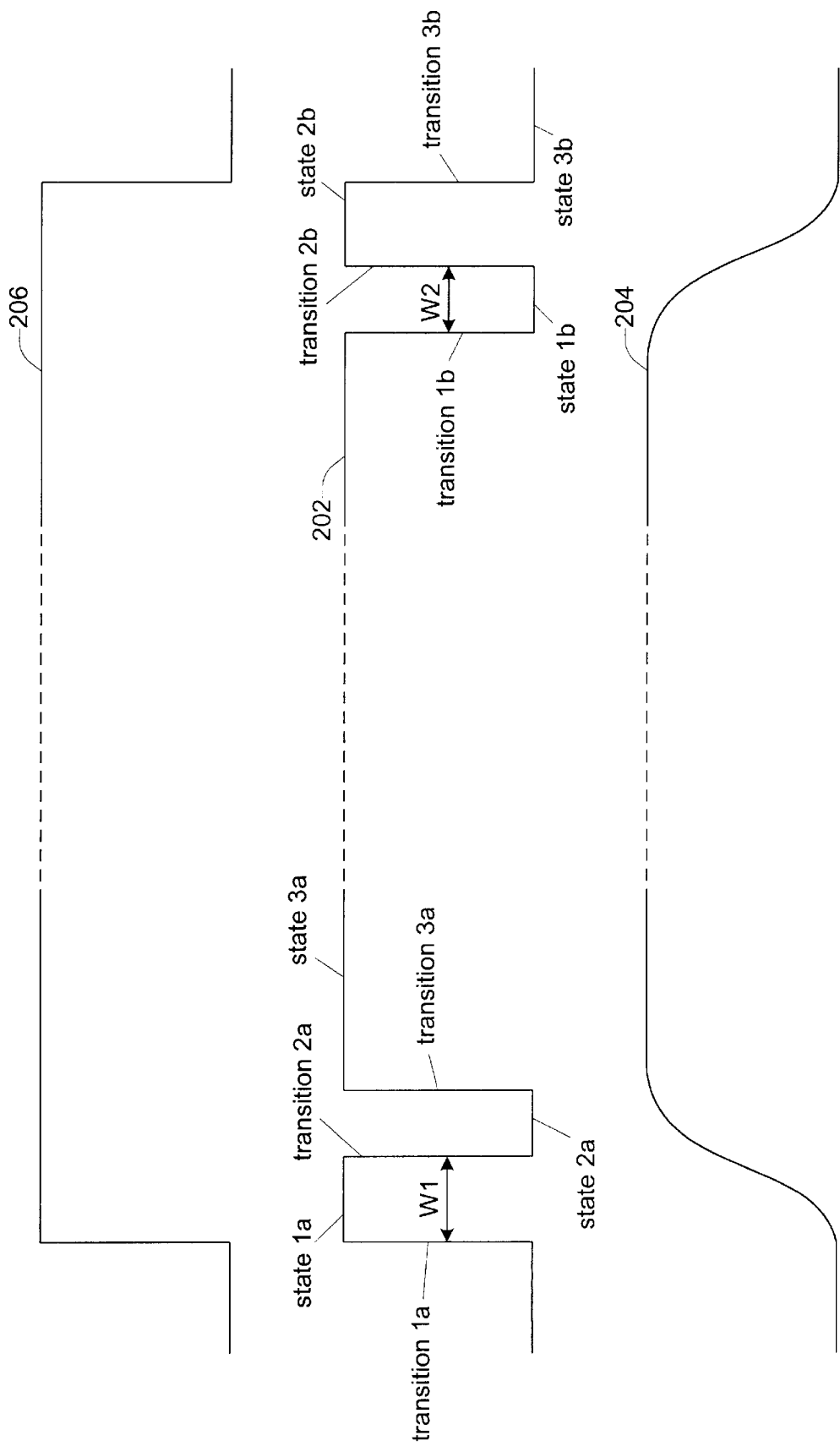
FIG. 2a is a series of waveforms illustrating a specific embodiment of the present invention.
Figure 2B:
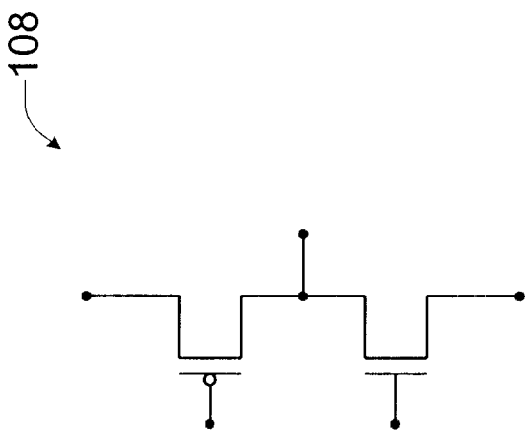
FIG. 2b is a simplified schematic of one possible implementation of gate drive circuitry for use with the present invention.

According to a specific embodiment, gate drive circuitry 108 of the noise-shaping amplifier of FIG. 1 is configured to operate in accordance with the principles of the present invention. This can be understood with reference to FIG. 2a in which both a rising and falling edge of the gate signal for one of the FETs are shown. The gate signal 202 is generated by gate drive circuitry 108 and the signal 204 is at the gate of the FET. The signal 204 shown could be generated for either one or both of FETs 102 and 104, the one being essentially the complement of the other. One possible implementation for gate drive circuitry 108 is shown in FIG. 2b. It will be understood, however, that a wide variety of drive circuits may be employed with this and other embodiments of the invention described herein without departing from the scope of the invention.

According to one embodiment, just enough energy is introduced into the resonance at the FET gate such that the signal 204 at the gate settles right at the desired input logic level. The width of the initial pulse for each logic transition in gate signal 202 determines this energy and is controlled by gate drive circuitry 108. That is, gate drive circuitry 108 is configured to receive a pulse train 206 from A/D converter 106 (which may be, for example, a comparator) and generate a gate signal in which each positive and negative transition of the pulse train from A/D converter 106 corresponds to the corresponding transition sequence shown in FIG. 2a.

So, for the transition from logic "0" to logic "1" of signal 206, gate drive circuitry generates an initial pulse in signal 202 of width WI which causes signal 204 to settle at logic 1. Signal 202 is then brought high again at some later point (i.e., the third transition) before the next transition of signal 206. At that point, a similar series of transitions occurs to bring about the transition to logic "0." As can be seen, not only does this prevent the ringing from the resonance, it also solves the overshoot/undershoot problem.

Because there is some resistance in series with the input of each FET, it is desirable that the width W of each initial transition pulse in signal 202 be wide enough to overcome the damping factor introduced by this resistance. Otherwise, the level of signal 204 might never reach the desired logic level. On the other hand, it is also desirable that the width W is not so wide that any significant overshoot or ringing occurs. Therefore, according to a specific embodiment of the present invention, an adaptive feedback loop may be provided which monitors the extent to which signal 204 either fails to reach or overshoots the desired logic levels, and using this information adjusts the timing of the transition pulses of signal 202 via gate drive circuitry 108.

According to a more specific embodiment, the adaptive loop includes at least one comparator which measures whether the signal level at the FET gate is too high or too low, and using a DAC, adjusts the bias current of one or more delay lines in gate drive circuitry 108 to adjust the timing of the transition pulses of signal 202 to thereby correct the excess or deficiency.

According to various embodiments, states 2a and 2b can be reached by turning off the drive circuit. The inductor current will provide transitions 2a, 2b, 3a, and 3b. This also implies that the timing of the third transition in signal 202 for each transition of signal 206 (e.g., transitions 3a and 3b) is not critical to the success of this technique. That is, the transition of the gate voltages of FETs 102 and 104 to the desired state occurs naturally due to the fact that the gate inductors naturally pull the gate voltage to the desired state and the parasitic diodes from the drain to the source of each gate drive device clamps the gate drive voltage (i.e., signal 202) temporarily. That is, when the energy in the gate resonance of the circuit decays, the gate voltage automatically decays to the desired level. In other words, the timing of the third transition of signal 202 (e.g., transitions 3a and 3b) is not necessarily a critical parameter.

It should also be noted that the width of the pulses in signal 202 need not necessarily be controlled such that the gate signal 204 settles to the desired logic level without oscillation. That is, embodiments are contemplated in which some amount of overshoot and resonance oscillation is allowed. Such embodiments, while arguably not as optimal as the embodiment described above, still benefit from the technique of the present invention in that, for example, the resonance oscillation may be limited to only a few (or even fractions of) periods.

Figure 3C:
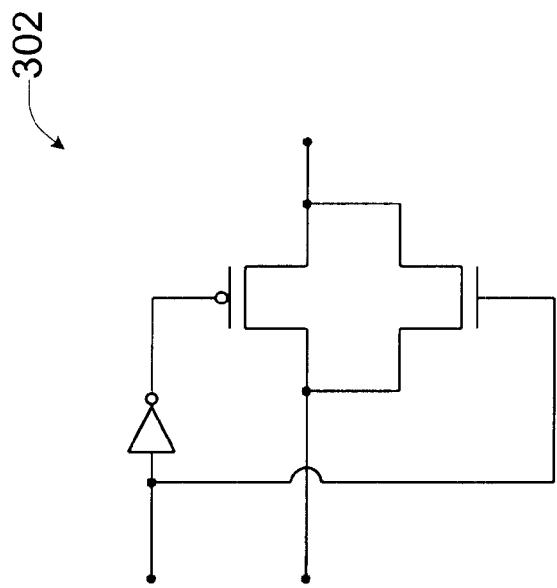
Figure 3B:
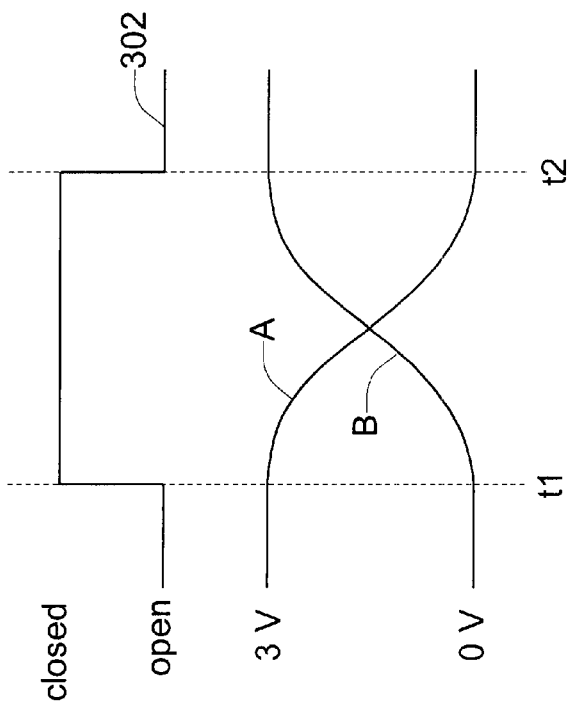
Figure 3A:
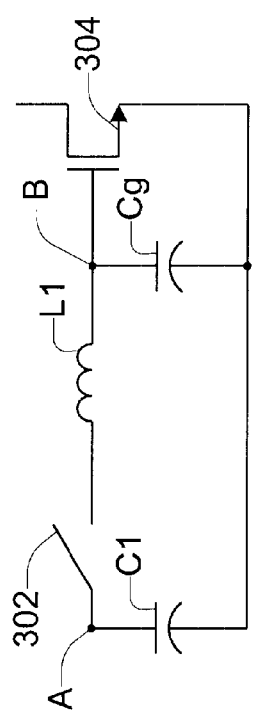
FIG. 3a is a simplified schematic diagram of another specific embodiment of the present invention.

Another specific embodiment of the present invention is shown in schematic of FIG. 3a. A simplified schematic is shown to indicate the general applicability of the technique. Operation of the circuit of FIG. 3a will be described with reference to FIG. 3b. In this embodiment, a floating switch 302 and an inductor L1 are used to charge the gate capacitance Cg of a switch 304 to a desired level. The drive signal is represented by another capacitor C1, energy being exchanged between the two capacitors without overshoot. According to a specific embodiment where the circuit is fabricated using CMOS technology, floating switch 302 may be implemented using back-to-back nMOS and pMOS devices as shown in FIG. 3c.

According to this embodiment, the desired logic level at node B is achieved simply by closing and then opening switch 302 at the appropriate time. As shown in FIG. 3b, when switch 302 closes at t1, the voltage at node A, i.e., 3 volts, begins to decay and charge the voltage at node B (i.e., the voltage across gate capacitance Cg) via inductor L1. Switch 302 is then opened again at the appropriate time t2 to ensure that node B reaches the desired level. The appropriate time t2 at which switch 302 is opened is the time at which nodes A and B have reached the alternate peaks. The ratio of Cg and C1 will affect the signal swing of nodes A and B. Also as discussed above, similar techniques may be employed to adaptively determine the ratio of C1 and Cg and the initial charge of C1.

In addition, the voltage level at node B may also be "topped off" using switches which connect node B to either high or low (e.g., 3 volts or 0 volts) at the appropriate time. Such a technique might be used, for example to overcome the damping effect of the series resistance associated with switch 302. In addition, the resistive damping introduced by switch 302 may be overcome by appropriately offsetting the respective values of C1 and Cg. That is, C1 may be made sufficiently larger than Cg to offset the amplitude of the resonance thereby overcoming the damping caused by switch 302.

While the invention has been described with reference to specific embodiments, it will be understood that the techniques described herein are much more widely applicable than the few application described. For example, FIG. 1 shows a bandpass embodiment of the present invention, e.g., an RF amplifier for use in cellular phone technology. However, the present invention is clearly applicable to other types of amplifiers such as, for example, a baseband audio amplifier. Therefore, the scope of the present invention should not be limited to the embodiments described herein, but instead should be determined with reference to the appended claims.

What is claimed is:

1. A method for switching a switch from a first logic state to a second logic state, the switch comprising a gate terminal having a gate capacitance and a resistance associated therewith, the gate terminal also having a series inductance coupled thereto, the method comprising, while the switch is in the first logic state, applying a pulse corresponding to the second logic state to the inductance, the pulse having a first level of energy associated therewith, the first level of energy being sufficiently high to overcome damping by the resistance and allow the gate terminal to reach a signal level corresponding to the second logic state thereby switching the switch to the second logic state, the first level of energy also being sufficiently low to mitigate oscillation due to the inductance and the gate capacitance such that the gate terminal settles at the signal level before a subsequent transition of the switch to the first logic state, the method further comprising applying an additional transition to the inductance following the pulse and before the subsequent transition.

2. The method of claim 1 wherein the first level of energy is such that the gate terminal settles at the signal level without overshooting the signal level.

3. The method of claim 1 wherein the first level of energy is such that the gate terminal settles at the signal level following a damped oscillation which overshoots the signal level.

4. The method of claim 1 wherein the first energy level corresponds to a pulse width.

5. The method of claim 4 further comprising adjusting the pulse width using an adaptive feedback loop which monitors the gate terminal.

6. The method of claim 1 wherein switching the switch from the first logic state to the second logic state comprises effecting a low-to-high transition.

7. The method of claim 1 wherein switching the switch from the first logic state to the second logic state comprises effecting a high-to-low transition.

8. The method of claim 1 wherein the resistance comprises an input resistance of the switch.

9. The method of claim 1 wherein the resistance comprises a combination of an input resistance of the switch and an external series resistance.

10. The method of claim 1 wherein the resistance comprises a combination of an input resistance of the switch and an external parallel resistance.

11. An electronic device, comprising:
a switch comprising a gate terminal having a gate capacitance and a resistance associated therewith, the gate terminal also having a series inductance coupled thereto, the switch being operable to switch between a first logic state and a second logic state; and
switch control circuitry configured to apply a pulse corresponding to the second logic state to the inductance while the switch is in the first logic state, the pulse having a first level of energy associated therewith, the first level of energy being sufficiently high to overcome damping by the resistance and allow the gate terminal to reach a signal level corresponding to the second logic state thereby switching the switch to the second logic state, the first level of energy also being sufficiently low to mitigate oscillation due to the inductance and the gate capacitance such that the gate terminal settles at the signal level before a subsequent transition of the switch to the first logic state, the switch control circuitry being further operable to apply an additional transition to the inductance following the pulse and before the subsequent transition.

12. The electronic device of claim 11 wherein the switch control circuitry is operable to control the first level of energy such that the gate terminal settles at the signal level without overshooting the signal level.

13. The electronic device of claim 11 wherein the switch control circuitry is operable to control the first level of energy such that the gate terminal settles at the signal level following a damped oscillation which overshoots the signal level.

14. The electronic device of claim 11 wherein the switch control circuitry is operable to control the first energy level by controlling a pulse width associated with the pulse.

15. The electronic device of claim 14 further comprising an adaptive feedback loop for monitoring the gate terminal and generating a feedback signal, the switch control circuitry using the feedback signal for adjusting the pulse width.

16. The electronic device of claim 11 wherein the switch control circuitry comprises a pair of transistors for generating the pulse.

17. The electronic device of claim 16 wherein the electronic device is fabricated using CMOS technology.

18. The electronic device of claim 17 wherein the pair of devices is configured in a half-bridge configuration.

19. The electronic device of claim 11 wherein the switch and the switch control circuitry are configured for baseband operation.

20. The electronic device of claim 19 wherein the baseband frequency range comprises the audio band.

21. The electronic device of claim 11 wherein the switch and the switch control circuitry are configured for bandpass operation.

22. The electronic device of claim 21 wherein the bandpass frequency range comprises the radio frequency band.

23. The electronic device of claim 11 wherein the electronic device comprises an audio amplifier.

24. The electronic device of claim 11 wherein the electronic device comprises a wireless communication device.

25. The electronic device of claim 11 wherein the electronic device comprises a line driver for a digital subscriber line.

26. The electronic device of claim 11 wherein the electronic device comprises a motor driver.

27. The electronic device of claim 11 wherein the resistance comprises an input resistance of the switch.

28. The electronic device of claim 11 wherein the resistance comprises a combination of an input resistance of the switch and an external series resistance.

29. The electronic device of claim 11 wherein the resistance comprises a combination of an input resistance of the switch and an external parallel resistance.

30. An oversampled, noise-shaping, mixed-signal processor, comprising:
at least one integrator stage in a feedback loop, the at least one integrator stage having an input;
a discrete time sampling stage in the feedback loop coupled to the at least one integrator stage, the discrete time sampling stage for
sampling an analog signal at a sample frequency only at discrete time intervals;
a switching stage in the feedback loop coupled to the sampling stage, the switching stage having an input and an output; and
a continuous-time feedback path from the output of the switching stage to the input of the at least one integrator stage;
wherein the switching stage includes the switch and switch control circuitry of claim 11.

31. A method for switching a first switch from a first logic state to a second logic state, the first switch comprising a gate terminal having a gate capacitance and a resistance associated therewith, the gate terminal also having a series inductance coupled thereto, the method comprising, while the first switch is in the first logic state, closing a second switch in series with the gate terminal of the first switch and the series inductance for a period of time thereby transferring first energy from a source coupled to the second switch to the gate capacitance, the period of time being controlled such that the first energy is sufficient to overcome damping by the resistance and allow the gate terminal to reach a signal level corresponding to the second logic state thereby switching the first switch to the second logic state, the first energy also being sufficiently low as to mitigate oscillation due to the inductance and the gate capacitance, wherein the period of time is adjusted using an adaptive feedback loop which monitors the gate terminal.

32. The method of claim 31 wherein the first energy is such that the gate terminal settles at the signal level without overshooting the signal level.

33. The method of claim 31 wherein the first energy is such that the gate terminal settles at the signal level following a damped oscillation which overshoots the signal level.

34. The method of claim 31 wherein switching the first switch from the first logic state to the second logic state comprises effecting a low-to-high transition.

35. The method of claim 31 wherein switching the first switch from the first logic state to the second logic state comprises effecting a high-to-low transition.

36. The method of claim 31 wherein the resistance comprises an input resistance of the first switch.

37. The method of claim 31 wherein the resistance comprises a combination of an input resistance of the first switch and an external series resistance.

38. The method of claim 31 wherein the resistance comprises a combination of an input resistance of the first switch and an external parallel resistance.

39. An electronic device, comprising:
 a first switch comprising a gate terminal having a gate capacitance and a resistance associated therewith, the gate terminal also having a series inductance coupled thereto, the switch being operable to switch between a first logic state and a second logic state;
 a second switch in series with the gate terminal of the first switch and the series inductance, the second switch being operable to be closed for a period of time while the switch is in the first logic state thereby transferring first energy from a source coupled to the second switch to the gate capacitance, the period of time being controlled such that the first energy is sufficient to overcome damping by the resistance and allow the gate terminal to reach a signal level corresponding to the second logic state and thereby switch the first switch to the second logic state, the first energy also being sufficiently low as to mitigate oscillation due to the inductance and the gate capacitance; and
 an adaptive feedback loop for monitoring the gate terminal and generating a feedback signal, the feedback signal being used in conjunction with the second switch to adjust the period of time.

40. The electronic device of claim 39 wherein the second switch is operable to control the period of time such that the gate terminal settles at the signal level without overshooting the signal level.

41. The electronic device of claim 39 wherein the second switch is operable to control the period of time such that the gate terminal settles at the signal level following a damped oscillation which overshoots the signal level.

42. The electronic device of claim 39 wherein the electronic device is fabricated using CMOS technology.

43. The electronic device of claim 39 wherein the second switch comprises back-to-back nMOS and pMOS devices.

44. The electronic device of claim 39 wherein the first and second switches are configured for base band operation.

45. The electronic device of claim 44 wherein the base band frequency range comprises the audio band.

46. The electronic device of claim 39 wherein the first and second switches are configured for band pass operation.

47. The electronic device of claim 46 wherein the band pass frequency range comprises the radio frequency band.

48. The electronic device of claim 39 wherein the electronic device comprises an audio amplifier.

49. The electronic device of claim 39 wherein the electronic device comprises a wireless communication device.

50. The electronic device of claim 39 wherein the electronic device comprises a line driver for a digital subscriber line.

51. The electronic device of claim 39 wherein the electronic device comprises a motor driver.

52. The electronic device of claim 39 wherein the resistance comprises an input resistance of the first switch.

53. The electronic device of claim 39 wherein the resistance comprises a combination of an input resistance of the first switch and an external series resistance.

54. The electronic device of claim 39 wherein the resistance comprises a combination of an input resistance of the first switch and an external parallel resistance.

55. A method for switching a switch from a first logic state to a second logic state, the switch comprising a gate terminal having a gate capacitance and a resistance associated therewith, the gate terminal also having a series inductance coupled thereto, the method comprising, while the switch is in the first logic state, applying a pulse corresponding to the second logic state to the inductance, the pulse having a first level of energy associated therewith, the first level of energy corresponding to a pulse width and being sufficiently high to overcome damping by the resistance and allow the gate terminal to reach a signal level corresponding to the second logic state thereby switching the switch to the second logic state, the first level of energy also being sufficiently low to mitigate oscillation due to the inductance and the gate capacitance such that the gate terminal settles at the signal level before a subsequent transition of the switch to the first logic state, the method further comprising adjusting the pulse width using an adaptive feedback loop which monitors the gate terminal.

56. The method of claim 55 wherein the first level of energy is such that the gate terminal settles at the signal level without overshooting the signal level.

57. The method of claim 55 wherein the first level of energy is such that the gate terminal settles at the signal level following a damped oscillation which overshoots the signal level.

58. The method of claim 55 further comprising applying an additional transition to the inductance following the pulse and before the subsequent transition.

59. The method of claim 55 wherein switching the switch from the first logic state to the second logic state comprises effecting a low-to-high transition.

60. The method of claim 55 wherein switching the switch from the first logic state to the second logic state comprises effecting a high-to-low transition.

61. The method of claim 55 wherein the resistance comprises one of an input resistance of the switch, a combination of an input resistance of the switch and an external series resistance, and a combination of an input resistance of the switch and an external parallel resistance.

62. An electronic device, comprising:
 a switch comprising a gate terminal having a gate capacitance and a resistance associated therewith, the gate terminal also having a series inductance coupled thereto, the switch being operable to switch between a first logic state and a second logic state;
 switch control circuitry configured to apply a pulse corresponding to the second logic state to the inductance while the switch is in the first logic state, the pulse having a first level of energy associated therewith, the first level of energy being sufficiently high to overcome damping by the resistance and allow the gate terminal to reach a signal level corresponding to the second logic state thereby switching the switch to the second logic state, the first level of energy also being sufficiently low to mitigate oscillation due to the inductance and the gate capacitance such that the gate terminal settles at the signal level before a subsequent transition of the switch to the first logic state; and
 an adaptive feedback loop for monitoring the gate terminal and generating a feedback signal;

wherein the switch control circuitry is operable to control the first energy level by adjusting a pulse width associated with the pulse using the feedback signal.

63. The electronic device of claim 62 wherein the switch control circuitry is operable to control the first level of energy such that the gate terminal settles at the signal level without overshooting the signal level.

64. The electronic device of claim 62 wherein the switch control circuitry is operable to control the first level of energy such that the gate terminal settles at the signal level following a damped oscillation which overshoots the signal level.

65. The electronic device of claim 62 wherein the switch control circuitry is operable to apply an additional transition to the inductance following the pulse and before the subsequent transition.

66. The electronic device of claim 62 wherein the switch control circuitry comprises a pair of transistors for generating the pulse.

67. The electronic device of claim 66 wherein the electronic device is fabricated using CMOS technology.

68. The electronic device of claim 67 wherein the pair of devices is configured in a half-bridge configuration.

69. The electronic device of claim 62 wherein the switch and the switch control circuitry are configured for baseband operation.

70. The electronic device of claim 69 wherein the baseband frequency range comprises the audio band.

71. The electronic device of claim 62 wherein the switch and the switch control circuitry are configured for bandpass operation.

72. The electronic device of claim 71 wherein the bandpass frequency range comprises the radio frequency band.

73. The electronic device of claim 62 wherein the electronic device comprises one of an audio amplifier, a wireless communication device, a line driver for a digital subscriber line, and a motor driver.

74. The electronic device of claim 62 wherein the resistance comprises one of an input resistance of the switch, a combination of an input resistance of the switch and an external series resistance, and a combination of an input resistance of the switch and an external parallel resistance.

75. An oversampled, noise-shaping, mixed-signal processor, comprising:
  at least one integrator stage in a feedback loop, the at least one integrator stage having an input;
  a discrete time sampling stage in the feedback loop coupled to the at least one integrator stage, the discrete time sampling stage for
  sampling an analog signal at a sample frequency only at discrete time intervals;
  a switching stage in the feedback loop coupled to the sampling stage, the switching stage having an input and an output; and
  a continuous-time feedback path from the output of the switching stage to the input of the at least one integrator stage;
  wherein the switching stage includes the switch and switch control circuitry of claim 62.

* * * * *